United States Patent [19]

Jackson

[11] 4,345,219
[45] Aug. 17, 1982

[54] FREQUENCY AGILE HOLD-SAMPLE-HOLD PHASE DETECTOR

[75] Inventor: Charles R. Jackson, St. Petersburg, Fla.

[73] Assignee: E-Systems, Inc., Dallas, Tex.

[21] Appl. No.: 121,346

[22] Filed: Feb. 14, 1980

[51] Int. Cl.³ .............................................. H03L 7/08
[52] U.S. Cl. .................................... 331/1 A; 331/17; 331/27; 328/134
[58] Field of Search ...................... 331/25, 27, 1 A, 17; 328/151, 133, 134; 307/511, 516, 523, 526

[56] References Cited

U.S. PATENT DOCUMENTS

| | | | |
|---|---|---|---|
| 3,701,909 | 10/1972 | Holmes et al. | 328/151 X |
| 3,826,988 | 7/1974 | Wise et al. | 328/133 X |
| 3,866,133 | 2/1975 | Debloois et al. | 328/134 X |
| 3,906,376 | 9/1975 | Bass . | |
| 3,973,212 | 8/1976 | Walloch . | |
| 3,991,322 | 11/1976 | Bush et al. | 328/151 X |
| 4,038,568 | 7/1977 | May et al. | 328/151 X |
| 4,099,125 | 7/1978 | Bennett, Jr. et al. | |
| 4,151,473 | 4/1979 | Coleman et al. | 331/25 X |

Primary Examiner—Siegfried H. Grimm
Assistant Examiner—Edward P. Westin
Attorney, Agent, or Firm—Albert M. Crowder, Jr.

[57] ABSTRACT

A frequency agile phase detector includes a digital frequency detector section connected to a hold-sample-hold phase detector section. The digital frequency detector develops control signals related to frequency differences between a reference periodic signal and a variable periodic signal. The control signal determines the amplitude of a voltage signal impressed across a first hold circuit. A sample signal acts to sample and transfer the sample voltage signal from the first to a second hold circuit so as to reduce phase differences between the reference and variable periodic signals. The detector is incorporated into a phase locked loop using the VCO output as the variable periodic signal so that acquisition and lockup of the loop is obtained even when the two periodic signals are decades apart. Additionally, the hold-sample-hold section aids in reducing the reference and sampling energy required which results in a spectrally pure output signal.

19 Claims, 3 Drawing Figures

FREQUENCY AGILE HOLD-SAMPLE-HOLD PHASE DETECTOR

TECHNICAL FIELD

The present invention relates to phase detectors used in phase locked loop circuits and, in particular, to a frequency agile digital phase-frequency detector coupled with a hold-sample-hold circuit to provide a DC reference signal for controlling the output frequency of a voltage control oscillator, and which provides for frequency acquisition despite frequency changes greater than the pull in ranges normally encountered.

BACKGROUND ART

Phase locked loop circuits have long been utilized to provide output frequency stability of a voltage controlled oscillator by developing control voltages which drive the VCO to the desired frequency. Such phase locked loop circuits commonly use phase detectors to compare the output frequency, sampled at the VCO, with a known reference frequency. Early phase detectors utilized analog techniques whereby the reference frequency generated a ramp voltage which was then sampled in response to the variable frequency sampled at the VCO. More recently, digital techniques have been utilized for phase detection.

Early digital techniques were based on the assumption that if the error or difference between the actual and the desired frequency was sufficiently small, the loop was linear in its operation. However, a sufficient increase in the error will cause prior art phase locked loop circuits to drop out of lock. Similarly, if the initial error is great enough, the system may never achieve a lock-up condition. F. M. Gardner in "Phaselock Techniques", John Wiley and Sons, Inc., 1966, discusses this problem in depth, defining several acquisition terms for a typical high-gain second order loop. The "pull-in range" approximation of Chapter 4 (Equation 4-29, page 45) describes a maximum frequency error that the phase locked loop will tolerate before failing to acquire lock-up. As a result, there is a delta frequency change which, if exceeded, will result in the probability of a VCO never locking up. In the prior art, to overcome this problem, coarse tune position circuits were used to pretune the VCO immediately on demand to within a fraction of a delta of final frequency.

The present invention overcomes the disadvantage of the prior art by providing a method and apparatus which provides a frequency agile acquisition mode that forces the VCO to the desired frequency regardless of large frequency errors.

SUMMARY OF THE INVENTION

The present invention provides a frequency agile hybrid phase detector using digital techniques in conjunction with a hold-sample-hold analog circuit to develop a control voltage proportional to the phase difference existing between two periodic signals. When used as part of a phase locked loop, the circuit acts to maintain output frequency stability and acts to provide frequency lock information when the voltage controlled oscillator (VCO) of the phase locked loop is programmed to a new output frequency outside of normal phase locked loop pull-in range. Further, the analog portion attenuates the phase detector reference output signal to provide a loop error signal having a very high signal/spurious noise ratio that results in an enhanced spectral purity output.

A phase detector in accordance with the present invention comprises first and second flip-flops interconnected through a third flip-flop to form an edge detector circuit. A periodic reference signal is coupled into the first flip-flop and a periodic variable signal is derived from the VCO output frequency and coupled into the second flip-flop. The output of the third flip-flop is determined by the phase difference between the reference and variable input signals. A constant current generator charges a capacitor through a transistor switch connected to the output of the third flip-flop such that the magnitude of the output as determined by the phase difference detected between the reference and variable signals sets the charging threshold of the capacitor. Thus, the charge impressed across the capacitor is a function of the relationship between the reference and variable periodic signals.

A sampling signal is derived from the source of the periodic reference signal and operates an electronic switch which samples the charged capacitor or first hold circuit and transfers and stores the sampled signal in another capacitor or second hold circuit. The transferred signal is then coupled through a DC amplifier and loop filter into the VCO as the control signal for controlling the output frequency of the VCO.

Accordingly, it is a feature of the present invention to provide a method and apparatus for deriving an error voltage proportional to the phase difference between a reference frequency and a frequency derived from the VCO output.

It is still another feature of the present invention to provide a frequency agile acquisition mode that forces the VCO to the desired frequency regardless of large frequency errors.

It is still another feature of the present invention to provide a loop error signal with a very high signal to spurious noise error ratio resulting in enhanced spectral purity of the signal coupled into the phase locked loop filter network.

These and other features and advantages of the present invention will become apparent from the following detailed description when considered in conjunction with the accompanying drawings:

BRIEF DESCRIPTION OF THE DRAWINGS

In order that the manner in which the above-recited advantages and features of the invention are obtained can be understood in detail, a more particular description of the invention may be had by reference to specific embodiments thereof which are illustrated in the appended drawings, which drawings shown are a part of this specification. It is to be noted, however, that the appendaged drawings illustrate only a typical embodiment of the invention and, therefore, are not to be considered limiting of its scope for the invention may admit to further equally effective embodiments.

In the drawings.

DETAILED DESCRIPTION OF THE INVENTION

Figure 1:
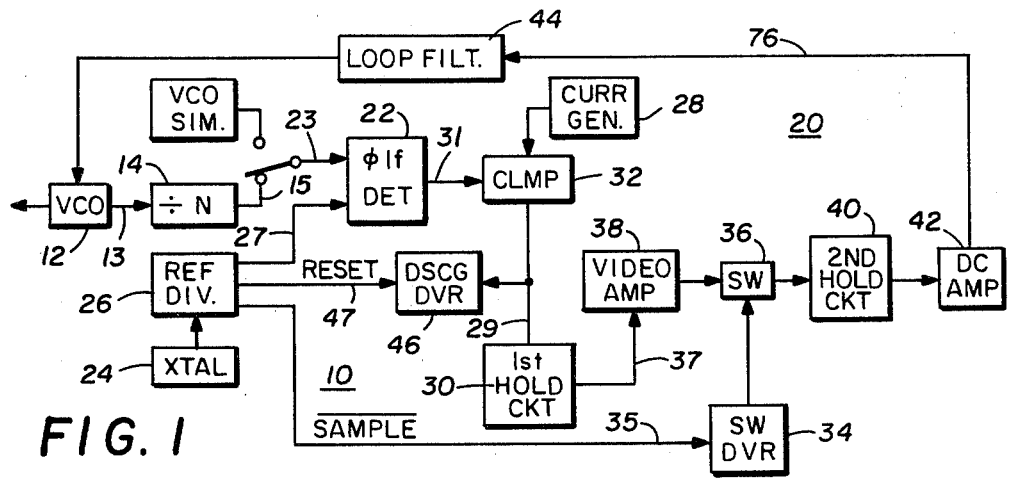
FIG. 1 is a block diagram illustrating a phase-locked loop circuit incorporating the frequency agile phase detector circuit of the present invention.

A phase locked loop circuit 10 incorporating a frequency agile hybrid phase detector, generally at 20, in accordance with the present invention is illustrated in FIG. 1. The output frequency signal generated by a voltage controlled oscillator (VCO) 12 is sampled and the sampled signal coupled via conductor 13 through a divide-by-N circuit 14 and, via conductor 15 through two position switch 23, into a digital phase/frequency detector circuit 22. The signal output of a crystal reference circuit 24 is coupled into a reference divider circuit 26 used to develop various operating or clock frequencies. One such clock frequency is a reference frequency which is coupled into phase/frequency detector circuit 22 via conductor 27. As will hereinafter be explained in greater detail, phase frequency detector circuit 22 compares the frequency difference between the two frequency signals inputted via conductors 15 and 27, and develops an output signal on conductor 31 having one of three basic states. The signal present on conductor 31 is coupled into a clamp circuit 32. The state of the signal developed on conductor 31 is dependent upon the frequency difference between the input signals as will hereinafter be discussed with respect to the waveforms 31, 31' and 31" depicted in FIG. 3, each representing one of the three basic signal states which may be present on conductor 31.

A constant current generator 28 provides a charging current to a first hold-circuit 30. The phase-related output signal from phase/frequency detector circuit 22 is coupled into clamp circuit 32 to set the threshold of the level of charge to be impressed across first hold-circuit 30.

Figure 2:
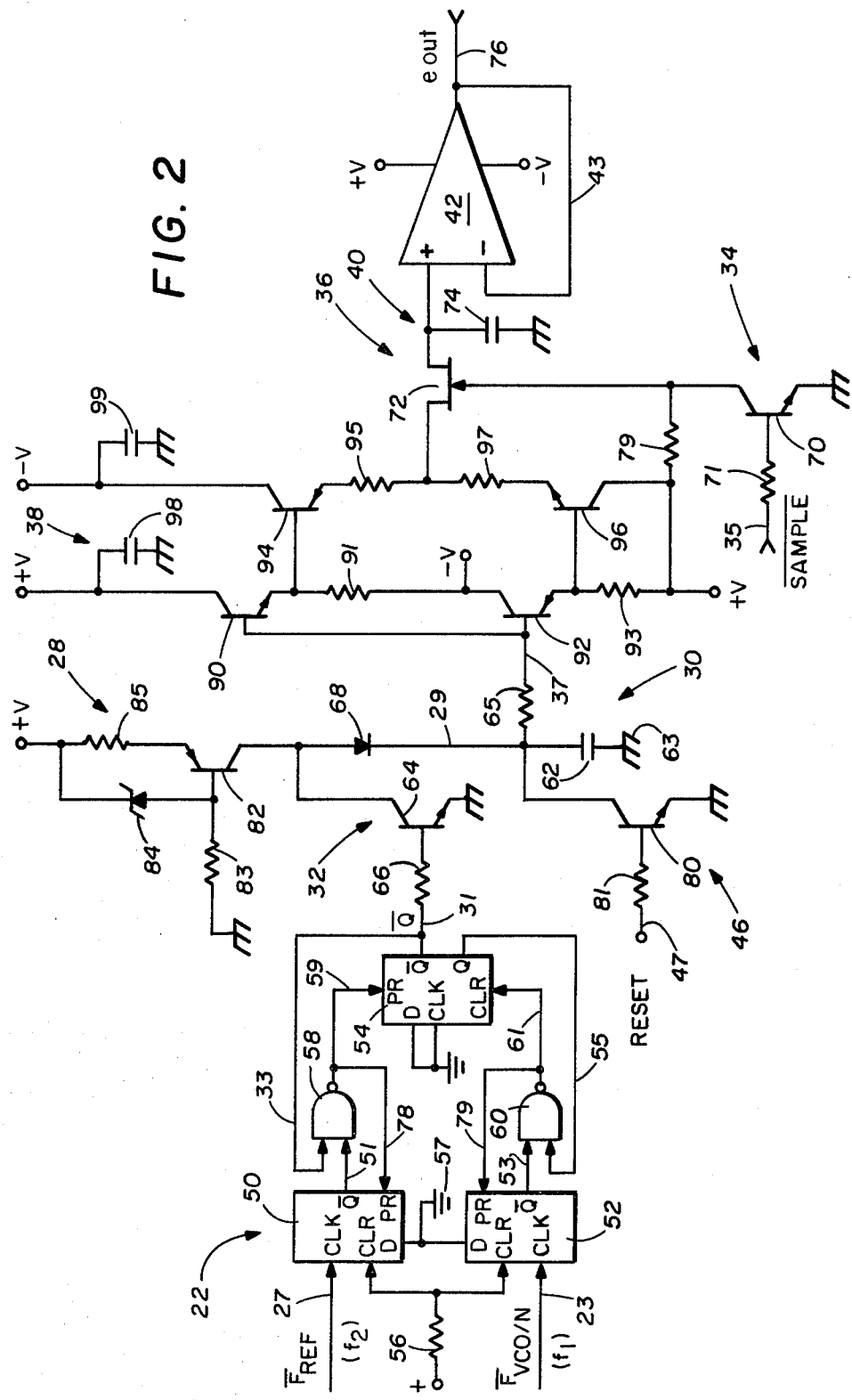
FIG. 2 is a schematic drawing illustrating the digital and analog circuitry forming the frequency agile phase detector of the present invention.

When the threshold is reached, clamp circuit 32 diverts the charging current of constant current generator 28 away from first hold circuit 30 and through clamp circuit 32 to chassis ground (shown typically as chassis ground 63 in FIG. 2). This diversion of the changing current acts to hold the signal value impressed across hold-circuit 30 at the required amplitude.

A second clock signal developed in reference divider 26 is coupled over conductor 35 into a switch driver 34, to operate an electronic switch 36 which initiates transfer of the sample or voltage signal from first hold-circuit 30 via conductor 37 and a video amplifier 38 into a second hold-circuit 40 which develops a control signal for eliminating phase differences between the two periodic signals.

The sample or voltage signal coupled into hold circuit 40 drives a DC amplifier 42 which provides a DC error signal via conductor 76 through loop filter 44 and into voltage controlled oscillator (VCO) 12 to control the oscillator output frequency.

Following the sampling of the voltage signal in hold-circuit 30, a third, or reset, signal is developed in reference divider 26 and coupled via conductor 47 into discharge driver 46, causing the already sampled voltage level coupled into hold circuit 30 to be discharged to ground.

In the preferred embodiment depicted in FIGS. 1 and 2, the actual circuits, as shown in FIG. 2, use complimentary logic and therefore complimentary signals will be used in describing the operation of the present invention. However, it is to be understood that such use of complimentary signals and complimentary digital and transistor logic is not intended as a limitation on the present invention and that positive digital and transistor logic circuits with their accompanying signals are with the purview of this invention.

Referring now to FIG. 2, the phase/frequency detector circuit 22 is shown to include first, second, and third digital flip-flops, 50, 52 and 54 respectively. The reference frequency $\overline{F}_{REF}$ (hereinafter referred to as $f_2$) developed in the reference divider 26 is coupled into the CLOCK port of flip-flop 50. Similarly, the variable frequency, $\overline{F}_{VCO/N}$ (hereinafter referred to as $f_1$), is developed by sampling the output frequency of voltage controlled oscillator 12 and coupling the sampled signal through the divide-by-N circuit 14 into the CLOCK port of flip-flop 52. A voltage is applied across a resistor 56 into the CLEAR ports of each of flip-flops 50 and 52, with the data input lead of both flip-flops connected to ground 57. The $\overline{Q}$ signal outputs of flip-flops 50 and 52 are coupled via conductors 51 and 53 through NAND gates 58 and 60 respectively and into the PRESET and CLEAR ports, over conductor 59 and 61, respectively, of flip-flop 54. Additionally, the outputs of NAND gates 58 and 60 are respectively coupled into the PRESET port of flip-flops 50 and 52 over conductors 78 and 79. The $\overline{Q}$ signal output of flip-flop 54 is coupled over conductor 33 to the remaining input of NAND gate 58, while the Q output of flip-flop 54 is coupled over conductor 55 to the remaining input of NAND gate 60. As shown, the circuit provides an edge detection circuit for comparing the input phases of two periodic signals wherein, and as will be hereinafter explained in greater detail with reference to the waveforms depicted in FIG. 3, the output, $\overline{Q}$, of flip-flop 54 is a periodic signal functionally related to the phase difference when $f_1$ is equal to $f_2$, but assumes one of two constant states when $f_1$ is unequal to $f_2$. When $f_1$ is less than $f_2$, the $\overline{Q}$ output is essentially 0 or low, whereas, when $f_1$ if greater than $f_2$, the $\overline{Q}$ output goes high, providing a DC voltage level output.

Figure 3:
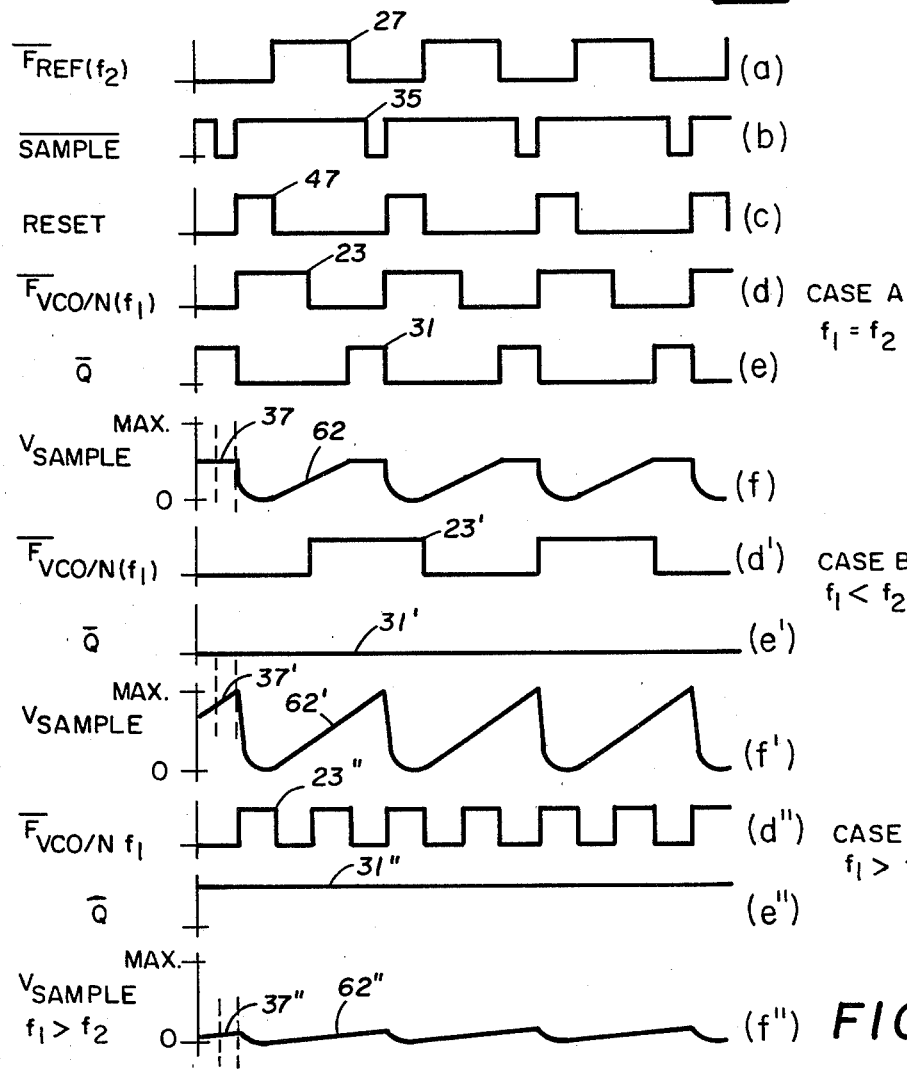
FIG. 3 illustrates a set of waveforms depicting the signals at various points on the frequency agile phase

Referring now to FIG. 3, the relationship for three cases (A, B, and C) is depicted. The first three waveforms which are present on conductors 27, 35, and 47 (indicated as 27, 35 and 47 respectively in FIG. 3) are the reference frequency signal, $\overline{F}_{REF}$ or $f_2$, present on conductor 27, the sample signal or $\overline{SAMPLE}$, present on conductor 35 and the reset signal present on conductor 47, all of which are derived by reference divider 26 from the basic crystal reference frequency provided from crystal reference 24.

Referring to case A, there is depicted a variable frequency, $\overline{F}_{VCO/N}$ or $f_1$, indicated as 23, which is derived by sampling the frequency of the voltage controlled oscillator 12 and passing the sampled signal through a divide-by-N circuit 14. In case A, $f_1$ is equal to $f_2$, resulting in an alternating setting and clearing of the $\overline{Q}$ output from flip-flop 54 giving the periodic $\overline{Q}$ signal indicated as 31 which is present on conductor 31. During this sequence, and referring also to FIG. 2, constant current generator 28 is increasing the voltage across the first hold-circuit 30, which comprises a capacitor 62 positioned between generator 28 and ground 63 (typical for all system or chassis grounds) so as to be charged by the current present on conductor 29. As indicated, the voltage potential on capacitor 62 increases linearly (indicated as 62 in FIG. 3) until there is a positive transition of the $\overline{Q}$ signal present on conductor 31. This initiates an on condition in clamp circuit 32, which includes a transistor 64 having its emitter connected to a chassis ground 63 and its collector connected to conductor 29. Thus, the $\overline{Q}$ signal is applied across base current limiting resistor 66 to the base of transistor 64, turning the transistor on and permitting the signal present on conductor 29 to be channeled to ground 63, whereby the voltage potential across capacitor 62 is clamped at the desired signal level by a diode 68 which is positioned between capacitor 62 and the connection of the collector of transistor 64 to conductor 29.

The sample pulse present on conductor 35 is coupled through base current limiting resistor 71 into the base of a transistor 70 which forms switch driver 34 and which has its emitter coupled to ground 63 and its collector connected to the gate of a field effect transistor 72, which acts as electronic switch 36. As the sample signal on conductor 35 makes a transition to 0, transistor 70 is switched off, permitting a positive voltage developed across collector load resistor 79 connected between the +V supply voltage and the collector of transistor 70, to be applied to the gate of FET 72, turning on switch 36 and permitting a sample of the voltage potential existing across capacitor 62 to be coupled via conductor 37 through Video amplifier 38 and via the source and the drain electrodes of FET 72, and impressed across capacitor 74 which comprises second hold circuit 40, indicated as 37 in FIG. 3. As the sample signal is raised again, transistor 70 is turned on removing the voltage from the gate of FET 72, clamping the sampled voltage impressed across capacitor 74. The voltage in hold circuit 30 thus impressed across capacitor 74 is used to drive DC amplifier 42 to produce a DC signal which is coupled through loop filter 44 as an error output signal on conductor 76 and into voltage controlled oscillator 12 to control the output frequency thereof. During this period, and subsequent to the sampling and transfer of the voltage impressed across capacitor 62 and its transfer to capacitor 74, a reset pulse is generated in reference divider 26 and coupled via conductor 47 and base current limiting resistor 81 into the base of transistor 80 which forms discharge driver 46 and which has its emitter connected to chassis ground 63 and its collector connected to conductor 29 at a point between diode 68 and capacitor 62.

As the reset pulse on conductor 47 transitions from low to high, operation of transistor 80 is initiated, discharging the voltage impressed across capacitor 62 through transistor 80 to ground 63.

Referring now to Case B, there is indicated at 23' the variable frequency $f_1$, derived by sampling the VCO 12 frequency and passing it through the divide-by-N circuit 14, and present on conductor 23. In the manner above-described for Case A, coupling this signal indicated as 23' into flip-flop 52 while at the same time coupling the reference frequency $f_2$ on conductor 27 into flip-flop 50, results in a $\overline{Q}$ output indicated as 31' from flip-flop 54 which remains in a low state on conductor 31. As a result, the charging current on conductor 29 causes the voltage indicated as 62' across capacitor 62 to increase linearly until such time as the sample signal transitions from high to low and a sample indicated as 37' is taken as above-described for case A. Since the $\overline{Q}$ signal is low, there is no clamping action to set a threshold level which maintains the voltage indicated as 62' impressed across capacitor 62 at a threshold. Thus, when the sampled voltage level 62' is coupled into the VCO 12 through loop filter 44, the VCO 12 frequency is increased due to the higher voltage level of the sample provided. This causes an increase in the output frequency of VCO 12, with a corresponding increase in $f_1$, until such time as the frequency of variable frequency $f_1$ is increased to equal the frequency of reference frequency $f_2$, which places the system in the above-described Case A mode and terminates further increases in the VCO 12 output frequency.

Referring now to Case C, the variable frequency $f_1$, present on conductor 23 and indicated as 23" in FIG. 3 is shown greater than the reference frequency $f_2$ present on conductor 27. Accordingly, the $\overline{Q}$ output indicated as 31" of flip-flop 54 which is present on conductor 31 goes high, clamping the voltage level indicated as 62" across capacitor 62 to a minimum or 0 voltage. Thus, and as above described for cases A and B, the voltage indicated as 37" sampled by initiation of switch 36 is very low, providing an error output voltage on conductor 76 which is also low and which, when coupled into VCO 12, acts to reduce the output frequency $f_1$ until frequency $f_1$ is equal to frequency $f_2$.

As above-described for FIG. 3, it is apparent that digital frequency detector section 22 functions to produce an error signal proportional to the difference in frequency between reference frequency ($f_2$) indicated as 27 and the variable frequencies ($f_1$) indicated as 23, 23' and 23" and corresponding to cases A, B and C respectively. By optimizing the detector 20 to produce an error signal having an amplitude of one half of the maximum amplitude when $f_1=f_2$, the digital detector section 22 operates to produce such error signals indicative of the relation between $f_1$ and $f_2$, i.e. when $f_1$ is less than $f_2$, the error signal is that depicted in Case B and will have amplitude corresponding to 37'. Additionally, when $f_1$ is greater than $f_2$, the error signal will be that indicated in Case C and will have an amplitude corresponding to 37". It thus becomes apparent that an error signal will be produced as long as a frequency difference exists between $f_1$ and $f_2$ with such signal acting upon circuit 20 to drive frequency $f_1$ toward frequency $f_2$ regardless of large frequency deltas therebetween. This ability of the detector 20 of the present invention to achieve frequency lock no matter how great the difference between $f_1$ and $f_2$ results in a frequency agility heretofore lacking in prior art circuits.

Further, combining the digital frequency detector 22 with the hold-sample-hold phase detection circuit of the invention as depicted at 20, substantially reduces the reference and sampling energy required to provide a spectrally pure output error signal. Such energy reduction results from the use of Video Amplifier 38 and DC Amplifier 42. While these devices are well known in the art, the use of their inherent characteristics is essential to the proper operation of the present invention. For example, the video amplifier 38 incorporates four transistors 90, 92, 94 and 96, each of which is configured as an emitter follower. These emitter follower configurations are interconnected as dual emitter followers into a complimentary push-pull configuration. Resistors 91 and 93 are provided in Amplifier 38 to establish steady state emitter currents for transistors 90 and 92 respectively. Current limiting resistors 95 and 97 are incorporated in Amplifier 38 to control the maximum current levels applied to transistors 94, 96 and FET 72. Additionally, filter capacitors 98 and 99 are interconnected between ground 63 and the +V and −V supply voltages connected to transistors 90 and 94 respectively to attenuate power supply noise introduced into Amplifier 38.

As shown, Video Amplifier 38 provides a high input impedance (z) to permit charging and discharging of capacitor 62, the first hold circuit, in accordance with digital detector section 22 timing.

Further, with its unity gain and no offset, Amplifier 38 permits accurately charging capacitor 74, the second hold circuit, to the exact level of charge on capacitor 62, without distortion, offsets, etc.

Additionally, the low output impedance, fast attach-/release, wideband response and high output current of Amplifier 38 permits proper charging of capacitor 74 from capacitor 62 within the duty cycle selected for optimum operation.

The DC Amplifier 42 is selected for many of the same basic characteristics as above-described for Amplifier 38. These characteristics permit the development of a DC error voltage signal $e_{out}$ on conductor 76 which is functionally related to the frequency offset between $f_1$ and $f_2$ and which may be utilized to operate a VCO at a desired frequency. As shown, amplifier 42 also utilizes $e_{out}$ as a negative feedback signal, via conductor 43, for proper operation of the amplifier.

Although shown in the block diagram of FIG. 1, constant current generators, such as generator 28, are well known in the art and will not be described in great detail except as to function. Constant current generator 28 comprises a PNP transistor 82 having its base coupled both to ground and to the emitter through a zener diode 84 and with its collector coupled to capacitor 62 which forms first hold circuit 30. A bias resistor 83 is interconnected to the connection between zener diode 84 and the base of transistor 82 and system ground to establish the bias current necessary for the proper operation of diode 84. Additionally, a resistor 85 is connected between the +V supply voltage and the emitter of transistor 82 to establish the required magnitude of current for proper operation of transistor 82. Thus, a positive voltage applied to the emitter of transistor 82 results in a constant current output from the collector of transitor 82 which is used to charge first hold circuit capacitor 62 in accordance with the above described operation of detection 20.

Although not shown on the drawings, it will be apparent to persons skilled in the art, that the output frequency of VCO 12 can be readily changed to a new output frequency through various methods well known in the art. Such methods include changing the reference frequency $f_2$ derived from reference divider 26 to a frequency which will develop an error output signal as has been above-described on conductor 76 and which is sufficient to develop an error signal to drive VCO 12 to the new frequency. Alternatively, it may be desirable to change the numerical divisor in the divide-by-N circuit 14 to achieve a change in the output of divider 26 and the divide-by-N circuit 14 output frequency may be used to provide the desired VCO 12 output frequency.

Additionally, it maybe desirable to incorporate test circuitry interconnected to the apparatus of the present invention to assist in system alignment and for determining proper system alignment and for determining proper system operation. Thus, and referring now to FIG. 1, there is included a frequency signal generator (VCO SIM) having an output connected to the remaining terminal of two position switch 23. VCO SIM is selected to generate an output frequency signal falling within the frequency range of $f_1$ as determined by the operational limits of VCO 12. Switch 23 may be any suitable switch capable of removing the variable frequency output of circuit 14 ($f_1$) from the input of detector 22 and replacing it with the fixed frequency output of VCO SIM, which will drive the output of VCO 12 to a frequency predetermined by the selection of the VCO SIM output frequency signal. Use of a known, fixed frequency signal to drive the system will permit system alignment and checkout.

Accordingly, while one embodiment of the invention has been illustrated, numerous variations and modifications may obviously be made in the structure herein described without depadrting from the present invention. Accordingly, it should be clearly understood that the form of the invention herein described and shown in the figures of the accompanying drawings are illustrative only and are not intended to limit the scope of the invention.

I claim:

1. A method for developing an output voltage level error signal related to frequency and phase differences between a reference periodic signal and a variable periodic signal for changing the value of said variable periodic signal to that of said reference periodic signal, comprising the steps of:
   (a) generating a control signal functionally related to frequency differences detected between the reference and variable periodic signals;
   (b) generating a constant current signal;
   (c) introducing said constant current signal into a first hold circuit to develop a voltage level therein;
   (d) clamping said voltage level developed in said first hold circuit at a level functionally related to said detected frequency differences in response to said control signal;
   (e) removing said constant current signal from said first hold circuit in response to said control signal;
   (f) periodically sampling said clamped voltage level signal for developing an error signal functionally related to phase differences detected between the reference and variable periodic signals and storing said error signal in a second hold circuit; and
   (g) developing from said stored error signal the output voltage level error signal proportional to frequency and phase differences between the reference and variable periodic signals.

2. The method of claim 1 wherein said steps of developing said output voltage level error signal includes:
   (a) periodically discharging said voltage level clamped in said first hold circuit to ground subsequent to said periodic sampling and re-introducing said constant current signal thereinto for developing an updated voltage level; and
   (b) periodically refreshing said voltage level in said second hold circuit to reflect changes in said frequency differences detected between the reference and variable periodic signals.

3. The method of claim 2, further including the steps of:
   (a) detecting leading edges of the reference periodic signal and providing time indications thereof;
   (b) detecting leading edges of the variable periodic signal and providing time indications thereof;
   (c) comparing said edge detection time indications of the reference and variable periodic signals to develop a differential signal with respect to such times of detection; and
   (d) generating said control signal in functional relation to said differential signal.

4. The method of claim 3 further including the steps of:
  (a) providing a source from which said reference periodic signal is derived;
  (b) developing a sampling periodic signal from said source;
  (c) transferring said developed and stored voltage level to said second hold circuit in response to said sampling periodic signal; and
  (d) storing said transferred voltage signal in said second hold circuit for developing the output voltage level error signal.

5. The method of claim 4 wherein said output voltage level error signal is coupled into a voltage controlled oscillator for controlling the output frequency thereof.

6. The method of claim 1 further comprising the steps of:
  generating said control signal in a first predetermined relation to said detected frequency difference when the frequency of the reference periodic signal is equal to the frequency of the variable periodic signal for maintaining the magnitude of said error signal at a predetermined value;
  generating said control signal in a second predetermined relation to said detected frequency difference when the frequency of the reference periodic signal is greater than the frequency of the variable periodic signal, said second predetermined relation different from said first predetermined relation, for increasing the magnitude of said error signal to said predetermined value; and
  generating said control signal in a third predetermined relation to said detected frequency difference when the frequency of the reference periodic signal is less than the frequency of the variable periodic signal, said third predetermined relation different from said first and second predetermined relations for decreasing the magnitude of said error signal to said predetermined value.

7. A method for controlling a variable periodic signal output from a voltage controlled oscillator by developing error signals functionally related to frequency and phase differences between a reference periodic signal and said variable periodic signal for changing the value of said variable periodic signal to that of said reference periodic signal, comprising the steps of:
  (a) generating a control signal functionally related to frequency differences detected between the reference and variable periodic signals;
  (b) generating a constant current signal;
  (c) introducing said constant current signal into a first hold circuit to develop a voltage level therein;
  (d) clamping said voltage level developed in said first hold circuit at a level functionally related to said detected frequency differences in response to said control signal;
  (e) removing said constant current signal from said first hold circuit in response to said control signal;
  (f) periodically sampling said clamped voltage level signal for developing an error signal functionally related to phase differences detected between the reference and variable periodic signals and storing said error signal in a second hold circuit; and
  (g) controlling the output frequency and phase of the voltage controlled oscillator with said stored error signal.

8. The method of claim 7 wherein said steps of developing said error signal includes:
  (a) periodically discharging said voltage level clamped in said first hold circuit to ground subsequent to said periodic sampling and re-introducing said constant current signal thereinto for developing an updated voltage level; and
  (b) periodically refreshing said error signal in said second hold circuit to reflect changes in said frequency differences detected between the reference and variable periodic 9. The method of claim 8, further including the steps of:
  (a) detecting leading edges of said reference periodic signal and providing time indications thereof;
  (b) detecting leading edges of said variable periodic signal and providing time indications thereof;
  (c) comparing said edge detection time indication of said reference and variable periodic signals to develop a differential signal with respect to such times of detection; and
  (d) generating said control signal in functional relation to said differential signal.

10. The method of claim 9 further including the steps of:
  (a) providing a source from which said reference periodic signal is derived;
  (b) developing a sampling periodic signal from said source;
  (c) transferring said developed and stored voltage level to said second hold circuit in response to said sampling periodic signal; and
  (d) storing said transferred voltage signal in said second hold circuit for developing the error signal.

11. The method of claim 7 further comprising the steps of:
  generating said control signal in a first predetermined relation to said detected frequency difference when the frequency of the reference periodic signal is equal to the frequency of the variable periodic signal, for maintaining the output frequency of the voltage controlled oscillator at a preselected value;
  generating said control signal in a second predetermined relation to said detected frequency difference when the frequency of the reference periodic signal is greater than the frequency of the variable periodic signal, said second predetermined relation different from said first predetermined relation, for increasing the output frequency of the voltage controlled oscillator to said preselected value; and
  generating said control signal in a third predetermined relation to said detected frequency difference when the frequency of the reference periodic signal is less than the frequency of the variable periodic signal, said third predetermined relation different from said first and second predetermined relations, for decreasing the output frequency of the voltage controlled oscillator to said preselected value.

12. A frequency agile phase detector for developing an output voltage level error signal proportional to frequency and phase differences between a reference periodic signal and a variable periodic signal, comprising:
  (a) comparator means for generating a control signal functionally related to frequency differences detected between the reference and variable periodic signals;
  (b) a constant current generator having an output connected to a first hold circuit;

(c) circuit means connected to said constant current generator output and responsive to said control signal for grounding said constant current generator output and isolating said first hold circuit;

(d) said first hold circuit developing and storing a voltage level functionally related to said frequency differences between the reference and variable periodic signals;

(e) means for generating a reset signal;

(f) means responsive to said control signal and to said reset signal for periodically correcting the amplitude of said stored voltage level in response to changes in said frequency differences detected between the reference and variable periodic signals;

(g) sample and hold circuit means connected to said first hold circuit for periodically sampling said developed and stored voltage level for developing a correction signal for removing phase differences between the reference and variable periodic signals and thereafter storing said correction signal; and (h) amplifier means connected to said sample and hold circuit means and responsive to said stored correction sigal for providing the output voltage level error signal.

13. The detector of claim 12, wherein said comparator means comprises:

(a) means for detecting leading edges of the reference and variable periodic signals and developing a frequency related time differential signal therefrom; and (b) means responsive to said time differential signal for generating said control signal.

14. The detector of claim 13, further including:

(a) means for generating a periodic sampling signal in phase relation with the reference periodic signal and having an output connected to said sample and hold circuit means; and (b) transfer means in said sample and hold circuit means and responsive to said sampling signal for periodically transferring a voltage level signal from said first hold circuit to a second hold circuit forming a part of said sample and hold circuit means.

15. The detector of claim 12 wherein said comparator includes:

means for generating first, second and third control signals, said first control signal generated when the reference signal and variable signal frequencies are equal, said first control signal operative to maintain the magnitude of said error signal at a predetermined value, said second signal different from said first control signal and generated when the reference signal frequency is greater than the variable signal frequency, said second control signal operative to increase the magnitude of said error signal to said predetermined value, and said third signal different from both said first and second signals and generated when the reference signal frequency is less than the variable signal frequency, said third control signal operative to decrease the magnitude of said error signal to said pedetermined value.

16. A frequency agile phase detector for controlling a variable periodic signal output from a voltage controlled oscillator by developing error signals proportional to frequency and phase differences between a reference periodic signal and said variable periodic signal, comprising:

(a) comparator means for generating a control signal functionally related to frequency differences detected between the reference and variable periodic signals;

(b) a constant current generator having an output connected to a first hold circuit;

(c) circuit means connected to said constant current generator output and responsive to said control signal for grounding said constant current generator output and isolating said first hold circuit;

(d) said first hold circuit developing and storing a voltage level functionally related to said frequency differences between the reference and variable periodic signals;

(e) means for generating a reset signal;

(f) means responsive to said control signal and to said reset signal for periodically correcting the amplitude of said stored voltage level in response to changes in said frequency differences detected between the reference and variable periodic signals;

(g) sample and hold circuit means connected to said first hold circuit for periodically sampling said developed and stored voltage level for developing a correction signal for removing phase differences between the reference and variable periodic signals and thereafter storing said correction signal; and (h) amplifier means connected to said sample and hold circuit means and responsive to said stored correction signal for providing the proportional error signal to the voltage controlled oscillator.

17. The detector of claim 16 wherein said comparator includes:

means for generating first, second and third control signals; said first control signal generated when the reference signal and variable signal frequencies are equal, said first control signal operative to maintain the output frequency of the voltage controlled oscillator at a preselected value; said second control signal different from said first control signal and generated when the reference signal frequency is greater than the variable signal frequency, said second control signal operative to increase the output frequency of the voltage controlled oscillator to said preselected value; and said third control signal different from both said first and second control signals and generated when the reference signal frequency is less than that of the variable signal, said third control signal operative to decrease the output frequency of the voltage controlled oscillator to said preselected value.

18. The detector of claim 16, wherein said comparator means comprises:

(a) means for detecting leading edges of the reference and variable periodic signals and developing a frequency related time differential signal therefrom; and (b) means responsive to said time differential signal for generating said control signal.

19. The detector of claim 18, further including:

(a) means for generating a periodic sampling signal in phase relation with the reference periodic signal and having an output connected to said sample and hold circuit means; and (b) transfer means in said sample and hold circuit means and responsive to said sampling signal for periodically transferring a voltage level signal from said first hold circuit to a second hold circuit forming a part of said sample and hold circuit means.

* * * * *